United States Patent
Saitou et al.

(10) Patent No.: US 6,727,178 B2
(45) Date of Patent: Apr. 27, 2004

(54) ETCHANT AND METHOD OF ETCHING

(75) Inventors: Noriyuki Saitou, Fukuoka (JP); Takuji Yoshida, Kumamoto (JP); Kazunori Inoue, Kumamoto (JP); Makoto Ishikawa, Fukuoka (JP); Yoshio Kamiharaguchi, Fukuoka (JP)

(73) Assignees: Mitsubishi Chemical Corporation, Tokyo (JP); Advanced Display Inc., Kikuchi-gun (JP)

( * ) Notice: Subject to any disclaimer, the term of this patent is extended or adjusted under 35 U.S.C. 154(b) by 0 days.

(21) Appl. No.: 10/419,179

(22) Filed: Apr. 21, 2003

(65) Prior Publication Data

US 2003/0207513 A1 Nov. 6, 2003

(30) Foreign Application Priority Data

Apr. 24, 2002 (JP) ........................................ 2002-122984

(51) Int. Cl.[7] ............................................... H01L 21/44
(52) U.S. Cl. ....................................... 438/688; 438/689
(58) Field of Search ................................ 438/688, 689, 438/706, 729, 730, 733, 734, 735, 745, 770, 775

(56) References Cited

U.S. PATENT DOCUMENTS

| | | | | |
|---|---|---|---|---|
| 4,220,706 A | * | 9/1980 | Spak | 430/318 |
| 4,345,969 A | * | 8/1982 | James et al. | 438/656 |
| 6,342,191 B1 | * | 1/2002 | Kepner et al. | 423/210 |

* cited by examiner

*Primary Examiner*—David Nhu
(74) *Attorney, Agent, or Firm*—Oblon, Spivak, McClelland, Maier & Neustadt, P.C.

(57) ABSTRACT

An etchant for patterning thin metal films by wet etching and in particular, an etchant for use in producing semiconductor devices, such as semiconductor elements and liquid-crystal display elements, is for application to a multilayer film having a first layer made of aluminum or an aluminum alloy having formed thereon a second layer made of aluminum or an aluminum alloy each containing at least one element selected from nitrogen, oxygen, silicon, and carbon, and has a phosphoric acid content of from 35 to 65% by weight and a nitric acid content of from 0.5 to 15% by weight; and an etching is performed using the etchant.

14 Claims, 3 Drawing Sheets

CHANGE OF TOTAL ACID PROPORTION IN ETCHANT WITH LAPSE OF TIME IN TREATMENT

CHANGE OF ETCHING TIME PROPORTION WITH LAPSE OF TIME IN TREATMENT

ETCHANT AND METHOD OF ETCHING

FIELD OF THE INVENTION

The present invention relates to an etchant for use in patterning thin metal films by wet etching and to a method of etching with the same. More particularly, the invention relates to an etchant and an etching method for use in the production of semiconductor devices such as semiconductor elements and liquid-crystal display elements.

BACKGROUND OF THE INVENTION

Recently, electrode and gate wiring materials for use in semiconductor devices such as semiconductor elements and liquid-crystal display elements are increasingly required to have a higher degree of precision in microfabrication. It has been proposed to use metallic materials having a lower resistance. Examples of metallic materials having a low resistance include aluminum and aluminum alloys, and these materials are coming to be used increasingly.

Examples of techniques for processing a thin film of such a metal to form a pattern of a microstructure such as a wiring include wet etching techniques in which a photoresist pattern formed on the surface of a thin metal film by photolithography is used as a mask to conduct etching with a chemical to thereby pattern the metal film, and further include dry etching techniques such as ion etching and plasma etching.

Compared to dry etching techniques, the wet etching techniques are economically advantageous in that they do not necessitate expensive apparatus and relatively inexpensive chemicals are used. In addition, by the wet etching techniques, substrates having a large area can be evenly etched while attaining high productivity per unit time. Because of these, the wet etching techniques are frequently used as a process for producing a thin-film pattern.

During such processing for wiring formation, there are cases where aluminum and aluminum alloys develop hillocks (blisterlike projections generating on aluminum surfaces upon heat treatment) in a heat treatment step, e.g., substrate heating in film deposition in a process for semiconductor device production. The generation of hillocks makes it difficult to superpose an insulating layer on the aluminum wiring. Namely, it has been known that even when an insulating layer is formed on the aluminum wiring having hillocks on its surface, the hillocks remain penetrating through the insulating layer, resulting in insulation failures. The protruding parts of the hillocks cause short-circuiting when they come into contact with another conductive thin film.

It is also known that when aluminum or an aluminum alloy is used as a wiring material and this wiring is directly contacted with ITO (indium oxide-tin oxide alloy) as a transparent electrode, then an altered layer is formed in that surface of the aluminum or aluminum alloy which is in contact with the ITO and, as a result, the contact part has increased contact resistance.

For preventing the hillock generation and altered-layer formation described above, various multilayer wirings have been proposed which comprise a layer of aluminum or an aluminum alloy and, superposed thereon, a layer of a different metal, e.g., a layer of a high-melting metal such as molybdenum, a molybdenum alloy, or chromium (see, for example, JP-A-9-127555, JP-A-10-256561, JP-A-2000-133635, JP-A-2001-77098, and JP-A-2001-311954). (The term "JP-A" as used herein means an "unexamined published Japanese patent application".)

However, in the wet etching of multilayer films, some combinations of metals have resulted in exceedingly low production efficiency because of the necessity of successively etching the individual layers constituting the multilayer film with two different etchants. It is known that even when an etchant with which all layers constituting a multilayer film can be simultaneously etched is used, cell reactions occur due to contact with each of the layers of different metals, resulting in a different etching behavior, such as a higher etching rate than in the case of single-layer etching. (See, for example, *SID CONFERENCE RECORD OF THE 1994 INTERNATIONAL DISPLAY RESEARCH CONFERENCE*, p.424.)

Consequently, a difference in etching rate arises between the metal layers, and this may result in under cutting in the lower metal layer (the phenomenon in which the lower metal layer is etched more quickly than the upper metal layer to leave overhangs of the upper metal layer) or side etching in the upper metal layer (the phenomenon in which the upper metal layer is etched more quickly than the lower metal layer). In particular, when under cutting has occurred, covering with a gate insulating film (e.g., $SiN_x$) in the overhang parts may be insufficient because the multilayer film after the etching has a profile which is not tapered, resulting in insulation resistance failures, etc.

For eliminating the problem described above, a multilayer wiring has been proposed which is formed from a multilayer film comprising a first layer made of aluminum or an aluminum alloy disposed on a surface of an insulating substrate and a second layer formed over the first layer and containing at least one impurity selected from nitrogen, oxygen, silicon, and carbon. (See, for example, JP-A-11-284195.)

Such multilayer films attain excellent productivity because only one kind of metal target is necessary for film deposition. This is because the second layer in this kind of multilayer film can be formed by: reactive sputtering in which a gas such as, e.g., $N_2$, $O_2$, or $CO_2$ is incorporated into a thin metal film deposited by sputtering or the like; plasma treatment in which the same gas as any of these is used; or a method in which a silicon-containing film such as $SiN_x$ or $SiO_x$ is formed on the surface and the resultant coating is annealed. Since this second layer can prevent the generation of hillocks and enables the formation of a multilayer film having excellent corrosion resistance, this technique is economically superior to the case in which films are separately formed with different metal targets.

Examples of general etchants for the second layer in such multilayer films, e.g., aluminum nitride or an aluminum nitride alloy, include aqueous sodium hydroxide solutions and hot phosphoric acid. Known as general etchants for aluminum or aluminum alloys are aqueous solutions having a phosphoric acid content of 70% by weight or higher and containing nitric acid and acetic acid.

However, use of alkaline etchants such as aqueous sodium hydroxide solutions has had an intrinsic problem that the photoresist resin layer patterned by photolithography dissolves away.

Furthermore, in the case where a multilayer film comprising a first layer made of aluminum or an aluminum alloy and a second layer formed thereon which is made of aluminum or an aluminum alloy each containing at least one of nitrogen, oxygen, silicon, and carbon is etched with any of the general etchants for aluminum (or alloys thereof), there has been a problem that the etching rate considerably differs between the constituent layers.

Specifically, not only the second layer (upper layer) has a lower etching rate even in single-layer etching, but also use of this etchant causes cell reactions with the superposed layers to further heighten the rate of etching of the first layer (lower layer). Because of this, under cutting is unavoidable in this etching and it has hence been extremely difficult to etch the superposed upper and lower layers so as to form a fine wiring line profile with high precision.

SUMMARY OF THE INVENTION

An object of the invention, which has been achieved under those circumstances, is to provide an etchant and etching method with which, when a multilayer film comprising a first layer made of aluminum or an aluminum alloy having a low resistance and a second layer formed thereon containing at least one of nitrogen, oxygen, silicon, and carbon is used as a wiring material, a fine wiring line profile with satisfactory precision can be obtained through one operation of etching the multilayer film while inhibiting under cutting (formation of overhangs).

The present inventors made intensive investigations in order to overcome the problems described above.

As a result, it has unexpected been found that such a multilayer film can be etched through one etching operation so as to have a desired wiring line profile when an etchant is used which contains phosphoric acid and nitric acid and has a composition in a specific range wherein the phosphoric acid content is lower than in existing etchants of this kind.

Specifically, the inventors have found that when an etchant which has a phosphoric acid content of from 35 to 65% by weight and a nitric acid content of from 0.5 to 15% by weight and which preferably further contains from 1 to 15% by weight acetic acid or contains from 0.1 to 15% by weight aliphatic or aromatic sulfonic acid and/or salt thereof is used for etching such as multilayer film, then this multilayer film can be etched, through one etching operation, to form a desired wiring line profile, e.g., a tapered shape, while inhibiting under cutting. The invention has been thus completed.

The invention provides an etchant for a multilayer film comprising a first layer made of aluminum or an aluminum alloy having formed thereon a second layer made of aluminum or an aluminum alloy each containing at least one element selected from nitrogen, oxygen, silicon, and carbon, the etchant having a phosphoric acid content of from 35 to 65% by weight and a nitric acid content of from 0.5 to 15% by weight. The invention further provides a method of etching with this etchant.

BRIEF DESCRIPTION OF THE DRAWINGS

The foregoing and other objects of the invention will be apparent from the following detailed description and the accompanying drawings, in which.

DETAILED DESCRIPTION OF THE INVENTION

Figure 1:
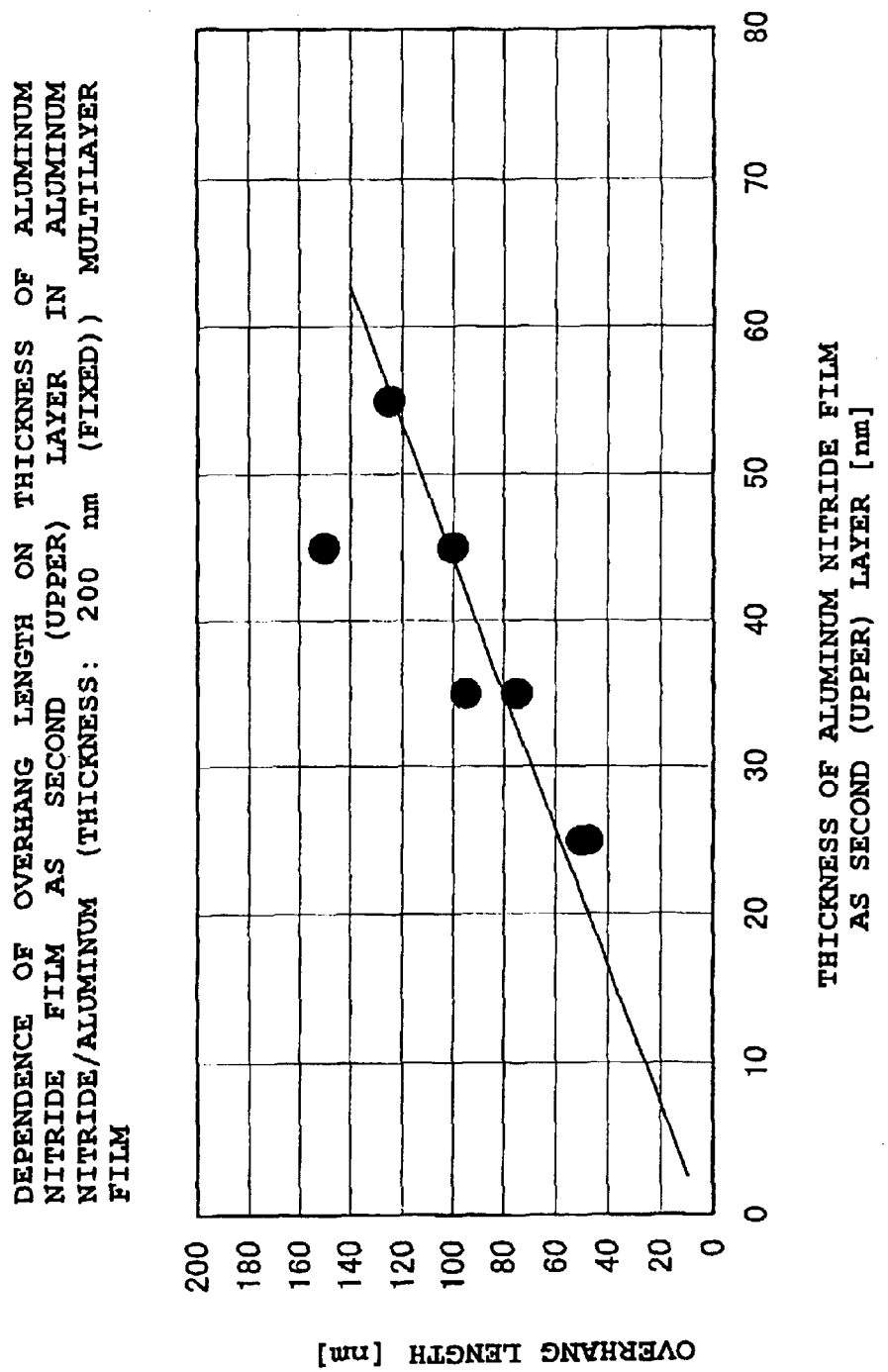
FIG. 1 is an illustration showing the relationship between aluminum nitride film thickness and overhang length in the etching of an aluminum nitride/aluminum multilayer film.

The invention will be explained below in detail. For the purpose of simplifying the explanation, aluminum nitride or an aluminum nitride alloy is used in the explanation as an example of the material of the second layer, which is made of aluminum or an aluminum alloy each containing at least one element selected from nitrogen, oxygen, silicon, and carbon, in the multilayer film to which the etchant of the invention is to be applied.

The etchant of the invention contains at least phosphoric acid and nitric acid. It has a phosphoric acid content of from 35 to 65% by weight, preferably from 45 to 55% by weight, and a nitric acid content of from 0.5 to 15% by weight, preferably from 3 to 12% by weight.

In case where the phosphoric acid content therein is too high, the difference in etching rate between the aluminum nitride or aluminum nitride alloy (second layer) and the aluminum or aluminum alloy (first layer) becomes larger although the rate of etching of the whole multilayer film becomes higher. As a result, under cutting proceeds and the second layer protrudes to form overhangs. On the other hand, too low phosphoric acid contents are impractical because the etching rate is too low.

Nitric acid not only contributes as an oxidizing agent to oxidation reactions of the metals but also functions as an acid for dissolution. The nitric acid content in the etchant of the invention influences etching characteristics like the phosphoric acid content. Specifically, in case where the nitric acid content is too high, the difference in etching rate between the first layer and second layer becomes larger although the rate of etching of the whole multilayer film becomes higher, so that under cutting proceeds and the second layer overhangs. There also is the possibility of damaging the photoresist resin layer. On the other hand, in case where the nitric acid content is too low, there is the possibility that the etching rate is too low.

In the etchant of the invention, the nitric acid reduces the adhesion of the second layer to the edges of the overlying photoresist pattern layer to thereby accelerate penetration of the etchant between these layers. Namely, the nitric acid moderately heightens the rate of side etching of the second layer, which is in contact with the photoresist, and thereby accelerates the etching of the second layer to diminish the tendency for the second layer to overhang due to under cutting.

When the etchant of the invention contains acetic acid or an aliphatic or aromatic sulfonic acid and/or salt thereof, it can perform further improved functions.

The incorporation of acetic acid is effective in improving the affinity of the etchant for the photoresist resin layer, which is hydrophobic. Namely, the etchant can be made to readily penetrate into finely intricate areas in a fine wiring structure finely patterned with a photoresist resin mainly present on a substrate surface. As a result, even etching is possible.

The content of acetic acid may be suitably determined according to the proportion of the area to be etched (ratio of the area of those metals present on the substrate which are to be etched to the area masked with the photoresist resin layer), etc. The acetic acid content is generally from 1 to 15% by weight, preferably from 2 to 10% by weight.

Use of an aliphatic or aromatic sulfonic acid and/or a salt thereof in place of acetic acid has the following advantages. The odor characteristic of acetic acid can be eliminated as a matter of course, and affinity for the photoresist resin layer is improved. Furthermore, since the sulfonic acid compound is less apt to volatilize unlike acetic acid, it simultaneously produces an effect that the etchant can be inhibited from changing in composition or nature during the etching step and more stable etching can be conducted. The sulfonic acid compound may be used in combination with acetic acid.

The aliphatic or aromatic sulfonic acid and/or salt thereof to be used in the invention is one comprising a sulfo group (—$SO_3H$) and an aliphatic hydrocarbon group or aromatic hydrocarbon group bonded thereto.

Examples of the aliphatic hydrocarbon groups include alkyl groups, alkenyl groups, and alkynyl groups. Examples of the aromatic hydrocarbon groups include phenyl, naphthyl, and tolyl.

It is preferred in the invention to use, in particular, an aliphatic sulfonic acid and/or a salt thereof which each has an aliphatic hydrocarbon group. The number of carbon atoms constituting the aliphatic hydrocarbon group in this compound is not particularly limited, and any aliphatic sulfonic acid and/or salt thereof may be suitably selected and used as long as it has excellent stability in the etchant. Specifically, the sulfonic acid compound preferably has an aliphatic hydrocarbon group having 1 to 10, especially 1 to 4, carbon atoms.

This hydrocarbon group may be either saturated or unsaturated, and may be linear or cyclic. However, linear hydrocarbon groups are preferred, and linear saturated hydrocarbon groups are especially preferred. Examples of the hydrocarbon group include methyl, ethyl, acetyl, n-propyl, isopropyl, propylene, n-butyl, isobutyl, and butylene. Preferred of these are methyl, ethyl, and n-propyl.

This aliphatic hydrocarbon group may have one or more substituents, which may be any desired ones. Examples of the substituents include hydroxyl, ether groups, ammonium group, halogens, nitro, cyano, carbonyl, alkoxycarbonyl, carboxyl, aldehyde groups, and sulfonyl.

Preferred examples of the aliphatic sulfonic acid and/or salt thereof to be used in the invention include methanesulfonic acid, ethanesulfonic acid, n-propanesulfonic acid, isopropanesulfonic acid, n-butanesulfonic acid, and salts of these. Preferred of these are ethanesulfonic acid, methanesulfonic acid, and salts of these. Especially preferred is methanesulfonic acid and/or a salt thereof.

The content of the aliphatic or aromatic sulfonic acid and/or salt thereof in the etchant of the invention may be suitably selected and determined according to the proportion of the area of those metals present on the substrate surface which are to be etched to the area masked with the photoresist resin layer. The content thereof is generally from 0.1 to 15% by weight, preferably from 0.5 to 10% by weight.

As in the case of acetic acid described above, too low contents of the aliphatic or aromatic sulfonic acid and/or salt thereof result in an insufficient effect and may impair affinity for the photoresist resin layer present on the substrate surface, making it impossible to conduct even etching. Conversely, even when the content thereof is too high, not only the photoresist resin layer may be damaged thereby, but also such high contents are economically disadvantageous in that a further improvement in effects which compensates for the increase in content cannot be attained.

A surfactant or the like may be added to the etchant of the invention for the purpose of reducing the surface tension of the etchant or reducing the contact angle with the substrate surface to thereby improve the ability to wet the substrate surface and enable even etching.

Fine particles present in the etchant of the invention may come to inhibit even etching as the pattern fineness becomes high. It is therefore desirable to remove such fine particles beforehand. The number of fine particles having a particle diameter of 0.5 $\mu$m or larger is preferably reduced to 1,000 per ml or smaller. An etchant having such a reduced particle content can be obtained by filtering the particle-containing etchant through a precision filter. Although the filtration may be performed by a one-through operation, it is preferred to conduct a cycle operation from the standpoint of the efficiency of removing fine particles.

As the precision filter can be used one having an opening diameter of 0.2 $\mu$m or smaller. As the material of the filter can be used, e.g., high-density polyethylene or a fluororesin such as polytetrafluoroethylene.

The etchant of the invention is an etchant for a multilayer film comprising a first layer made of aluminum or an aluminum alloy and formed thereon a second layer made of aluminum or an aluminum alloy each containing at least one element selected from nitrogen, oxygen, silicon, and carbon.

In this multilayer film, the ratio of the thickness of the second layer to that of the first layer (second layer thickness/first layer thickness) is not particularly limited. However, this layer thickness ratio is preferably from 1/10 to 1/1 because the effects described above are significant when the multilayer film having a layer thickness ratio within this range is etched.

Multilayer films comprising a first layer made of aluminum or an aluminum alloy and formed thereon a second layer made of aluminum or an aluminum alloy each containing at least one element selected from nitrogen, oxygen, silicon, and carbon are utilized, for example, as the wirings and gate electrodes formed on surfaces of substrates for liquid-crystal displays. Examples of metallic materials for use as such wirings and electrodes include multilayer films comprising an aluminum or aluminum alloy layer and a layer of aluminum nitride or an aluminum nitride alloy as the second layer.

The first layer in the multilayer films shown above is made of aluminum or an aluminum alloy. This means that the first layer is mostly constituted of aluminum or an aluminum alloy, and does not deny the presence of other elements as impurities. Examples of such impurities include sulfur, magnesium, sodium, and potassium. It is, however, preferred that such impurities have been diminished to the lowest possible level. Specifically, the content of such impurities is preferably 200 ppm or lower. In particular, the content of sodium and potassium is preferably 20 ppm or lower because these elements may exert considerable influences on properties of the semiconductor element.

The second layer is made of aluminum or an aluminum alloy each containing at least one element selected from nitrogen, oxygen, silicon, and carbon. By positively incorporating one or more such other elements, the first layer can be prevented from developing hillocks and suffering alteration, etc. In addition, since film deposition can be carried out with one kind of target metal material, effects such as step simplification can be produced. Although the content of these elements in the second layer is not particularly limited, it is generally preferably 1 atomic percent (at %) or higher, especially 5 at % or higher, and is generally 45 at % or lower.

This multilayer film may be produced by a known method.

The etching method of the invention may be carried out by any desired procedure using a known machine or apparatus for wet etching.

For example, for contacting the etchant with a multilayer film to be etched, use can be made of a method in which that surface of a substrate which has this multilayer film is sprayed with the etchant, for example, from the direction perpendicular to the surface (spraying method) or a method in which the substrate is immersed in the etchant (immersion method).

Especially in the spraying method, it is important to regulate the distance between the substrate to be etched and the spray nozzle and the spray pressure, while taking account of the liquid state (especially viscosity) of the etchant, to determine the amount of the etchant to be supplied to the substrate surface and the force of the etchant striking on the substrate surface. The distance between the substrate surface and the spray nozzle is preferably from 50 to 1,000 mm. The spray pressure for the etchant of the invention is generally from 0.01 to 0.3 MPa, preferably from 0.02 to 0.2 MPa, more preferably from 0.04 to 0.15 MPa, especially preferably from 0.04 to 0.08 MPa. Use of a spray pressure of 0.08 MPa or lower is especially preferred in that not only the etching rate of especially the second layer (e.g., AlNdN) becomes high and, as a result, the difference in etching rate between the first layer and second layer becomes small to enhance the effect of diminishing overhang formation, but also productivity in the etching apparatus improves. Furthermore, use of a spray pressure of 0.04 MPa or higher is especially preferred in that the etchant ejected from the spray nozzle can spread more evenly and, hence, even etching can be conducted. In the invention, the term "spray pressure" implies the pressure applied for supplying the etchant to the spray nozzle. By spraying the etchant over the substrate at this spray pressure, a moderate force is applied to the substrate surface and the surface can be evenly etched.

Etchant spray forms (spray nozzle shapes) are not particularly limited, and examples thereof include fan forms and cone forms. It is preferred that a necessary number of spray nozzles should be arranged along a substrate width direction and along a substrate travel direction and oscillated during spraying so that the etchant evenly strikes on the whole substrate surface. Simultaneously with the spraying of the etchant, the substrate itself may be reciprocated.

In the etching method of the invention, the temperature of the etchant may be suitably selected from general etching temperatures (from 20 to 60° C.). It is especially preferred to conduct the etching at from 40 to 50° C. from the standpoint of a balance between etching rate improvement and etching control.

For monitoring the progress of etching in the etching method of the invention, any desired monitoring technique can be used. For example, use may be made of a technique in which the etching state of that part (peripheral part) of a light-transmitting substrate (hereinafter sometimes referred to simply as "substrate") which is not covered with a photoresist pattern formed on the surface thereof or a part thereof located at the contour of the photoresist pattern is monitored by continuously measuring the changing light transmittance to thereby determine the amount of metals removed by etching. Thus, the progress of etching can be monitored.

Namely, light transmittance changes abruptly as the thin metal layers in that part (peripheral part) of the substrate which is not covered with the photoresist pattern formed on the surface thereof or in a part located at the contour of the photoresist pattern is wholly dissolved away. This change can be utilized to detect an etching end point. In the invention, the time period required after etching initiation until the detection of that end point at which "transmittance changes abruptly" is referred to as just etching time. This end point may be determined, for example, by visually judging the point of time at which the metals in an area to be etched are wholly dissolved away by etching and the substrate is exposed. Alternatively, an actinometric (transmitted-light) automatic detector or the like may be used to determine, as an end point, the point of time at which the quantity of light transmitted through the substrate exceeds 0.1% of the quantity of light through the substrate in a completely transmitting state (the quantity of transmitted light when nothing is present on the substrate).

Over etching preferably is conducted in the etching method of the invention because metal residues are present on the substrate surface at the time of end point detection.

It is preferred in the etching method of the invention that after the end point detection, etching (over etching of 100% or longer) be successively conducted under the same etching conditions for a period equal to (100%) or longer than the just etching time before the etching is completed. It is especially preferred that the time period of this over etching be regulated to from 150% to 500%, especially from 150% to 300%, of the just etching time.

When the over etching time is too short, there are cases where residues remain. When the over etching time is too long, there are cases where fine patterns such as multilayer film wirings are excessively etched due to side etching and come to have a reduced line width and this makes the device unable to work.

In general, when a substrate is etched by the wet etching method, ingredients in the etchant are consumed by the etching of the metals constituting the multilayer film or vaporize off. Furthermore, etchant ingredients in wet etching adhere to and are taken out of the etching system by the substrates. Since the amount of each ingredient in the etchant thus decreases, the etchant composition changes. In addition, the concentration of metal ions (main elements are aluminum and others which constitute the multilayer film) increases.

Especially in the method of wet etching by spraying, which is being frequently used from the standpoint of productivity, there is a strong tendency for the relative acid concentration to increase with diminution of volatile ingredients by vaporization.

It is noted that compared to ordinary etchants for aluminum (phosphoric acid concentration: 70% by weight or higher), the etchant of the invention has a low content of phosphoric acid (35 to 65% by weight), which is a high-boiling ingredient, and contains low-boiling ingredients (water, acetic acid, and nitric acid) in a relatively high proportion. Because of this, it is desirable for more efficiently conducting etching by the etching method using the etchant of the invention that ingredients corresponding to those which have gone out of the etching system, such as the low-boiling ingredients which have vaporized off in the etching step and the ingredients contained in the etchant which has adhered to and been taken out by the substrate during the etching treatment, be additionally supplied to the etching system continuously or intermittently. Thus, stable etching can be conducted.

In this case, it is preferred in the etching method of the invention that etchant ingredients corresponding to those consumed by etching or taken out of the etching system should be additionally supplied to the etchant so as to result in a total acid amount of from 0.8A to 1.5A[meq/g], wherein A is the total acid amount [meq/g] in the etchant before the etching, preferably from 0.9A to 1.2A [meq/g], and in a phosphoric acid content of from 35 to 65% by weight and a nitric acid content of from 0.5 to 15% by weight, and the resultant etchant be used to conduct etching. The term "total acid amount A" in the invention means the amount of all acid ingredients in 1 g of the etchant, in terms of milliequivalent concentration [meq/g]. The total acid amount A may be determined from the amount of an alkali ingredient (e.g., sodium hydroxide) required for neutralizing the etchant of the invention.

For replenishing etchant ingredients in the etching method of the invention, any desired technique may be used. Examples thereof include the following.

For example, a technique may be used in which an etchant replenisher composition, amount thereof, and replenishment timing are determined beforehand. The composition of low-boiling ingredients (e.g., acetic acid and water) which vaporize in an etching step can be specified when the etchant composition and etchant temperature are kept constant. This is because vapor-liquid equilibrium holds when the composition of the initial etchant (original etchant) and the temperature of the etchant are fixed. The amount of the etchant which vaporizes (vaporization rate) depends on the degree of evacuation of the etching system (amount of gases discharged from the etching system), etc. Consequently, changes in etchant composition after etching initiation can be determined beforehand by taking these factors into account and, based on this, a replenisher composition, replenisher amount to be added, and replenishment timing can be determined.

The composition and amount of ingredients which vaporize during an etching step can be calculated from a concentration change in the etchant per unit time period measured with an existing concentration analyzer, when the etching conditions (etchant composition, etchant temperature, etc.) are constant. Consequently, a replenisher composition, replenisher amount to be added, and replenishment timing may be determined from these values calculated.

Alternatively, use may be made of a method in which an existing concentration analyzing apparatus is used to continuously or intermittently monitor the composition of the etchant in an etching step and etchant ingredients are continuously or intermittently supplied to the etching system based on the results of the analysis.

Etchant ingredients are additionally supplied continuously or intermittently, while taking account of the thus-calculated amount of each ingredient to be added, so as to result in a total acid amount of from 0.8A to 1.5A [meq/g], wherein A is the total acid amount [meq/g] in the etchant before the etching, preferably from 0.9A to 1.2A, and in a phosphoric acid content of from 35 to 65% by weight and a nitric acid content of from 0.5 to 15% by weight. Thus, continuous etching may be conducted. The etchant ingredients to be additionally supplied may be added either separately or as a mixture thereof.

It is also noted that the amount of the etchant present in the etching system decreases with the progress of etching because part of the etchant adheres to and is taken out of the etching system by the substrate which has been etched. When the etchant amount decreases considerably, there are cases where, in wet etching by spraying, for example, cavitation or the like occurs in the etchant feed pump to make it difficult to continuously conduct stable wet etching. Such a reduced etchant amount may arouse a trouble that the etchant heater or the like disposed, for example, in the etchant tank is exposed on the liquid surface and, hence, the control of etchant temperature becomes insufficient. It is therefore preferred that an etchant (original etchant) be suitably added so that the etchant amount in the etching system is kept on a level within a certain range.

For example, this replenishment may be accomplished in the following manner. A weight change per substrate through etching is determined, or the concentration of acids brought into the rinsing step conducted subsequently to the etching step is determined. The amount of the etchant to be taken out of the etching system is calculated beforehand from the weight change or the acid concentration and from the number of substrates to be etched. An etchant (original etchant) is additionally supplied in this amount calculated.

By thus regulating the concentration of each ingredient and concentration of metal ions in the etchant, the etchant can be used while being recycled. This method is hence advantageous also from the standpoint of profitability.

The multilayer film comprising a combination of aluminum nitride or an aluminum nitride alloy with aluminum or an aluminum alloy can be stably and evenly etched with high precision through one etching operation to obtain the desired wiring line profile having no overhangs.

The etchant and etching method of the invention are effective also for low-resistance metallic materials other than aluminum and the aluminum alloys shown above, such as silver, molybdenum, and alloys thereof.

The invention will be explained below in more detail by reference to Examples, but the invention should not be construed as being limited to the following Examples unless the invention departs from the spirit thereof.

REFERENCE EXAMPLE

Four different multilayer-film wiring samples which each had a lower layer of aluminum having a fixed thickness of 200 nm and an upper layer of aluminum nitride and which respectively had upper-layer thicknesses of 25 nm, 35 nm, 45 nm, and 55 nm were etched with an etchant heretofore in general use for aluminum or aluminum alloys (78.5% by weight phosphoric acid, 2.85% by weight nitric acid, and 3.02% by weight acetic acid (the remainder being water)). After the etching, each multilayer film was examined for profile (overhang length) and the length of the overhang was measured. The results obtained are shown in FIG. 1.

The results show that overhangs having a length of from 50–60 nm or longer were formed when the thickness of the aluminum nitride layer was 20 nm or larger, i.e., when the proportion of the thickness of the upper aluminum nitride layer to that of the lower aluminum layer (upper aluminum nitride layer/lower aluminum layer) was 1/10 or larger. In such a wiring in which the upper metal layer (aluminum nitride) protrudes to form large overhangs, it is extremely difficult to cover the overhangs even when formation of an insulating film thereon by sputtering or the like is attempted. Sufficient insulation resistance posing no problem concerning electrical properties cannot be imparted to wirings having such a profile. It is therefore apparent that use of such wirings causes insulation resistance failures and brings about a considerable decrease in product yield.

Examples 1 to 7 and Comparative Examples 1 and 2

On a glass substrate was deposited AlNd (aluminum-neodymium alloy; neodymium content, 2 at %) in a thickness of 200 nm as a thin metal layer by sputtering using argon gas. Subsequently, AlNdN (aluminum nitride-neodymium alloy) was successively deposited in a thickness of 50 nm on the surface of the AlNd layer by reactive sputtering using an argon/nitrogen mixed gas. Thus, an AlNdN/AlNd multilayer film was formed. The nitrogen content in the AlNdN film as the upper layer was regulated to about 30 at %.

A positive photoresist resin layer (about 1.5 μm) was further formed thereon by spin coating, and this layer was treated by photolithography to form a fine wiring pattern. The line width of this photoresist pattern was about 5 μm.

This substrate was cut into pieces having a width of about 10 mm and a length of 50 mm, and these pieces were used as etching test samples.

Phosphoric acid (85% by weight), nitric acid (70% by weight), acetic acid (glacial acetic acid), and pure water were mixed together so as to result in the compositions shown in Table 1. Thus, etchants were prepared. In 200-ml beakers were placed 200 g each of the etchants. The temperatures of these etchants were adjusted to the values shown in Table 1. The etching test samples described above were immersed in the etchants and etched while moving the samples up and down and from side to side.

The time period from etching initiation to an end point was regarded as just etching time. The end point was the point of time at which those metals on the substrate which were located in an area to be etched had been wholly dissolved away and the substrate was exposed (became transparent); this change was visually judged.

Given over etching times were suitably determined through calculation from the just etching time and the amount of the metal to be removed by over etching (over etching amount).

After completion of over etching for a given period, the sample was taken out and rinsed with pure water (Milli QSP, manufactured by Nippon Millipore Ltd.) for 1 minute, and then dried with clean air.

The surface state of each substrate after completion of the etching was examined with the following apparatus (1) and (2).
(1) Examination of the state of photoresist resin layer (for swelling, cracks, etc.):
   Laser microscope (VK-8500, manufactured by Keyence Corp.)
(2) Examination of wiring line profile (for overhang state and residues around electrode):
   Scanning Electron Microscope (SEM) or Focused Ion Beam (FIB) (FB-2000A and C-4100, manufactured by Hitachi Ltd.)

Figure 2:
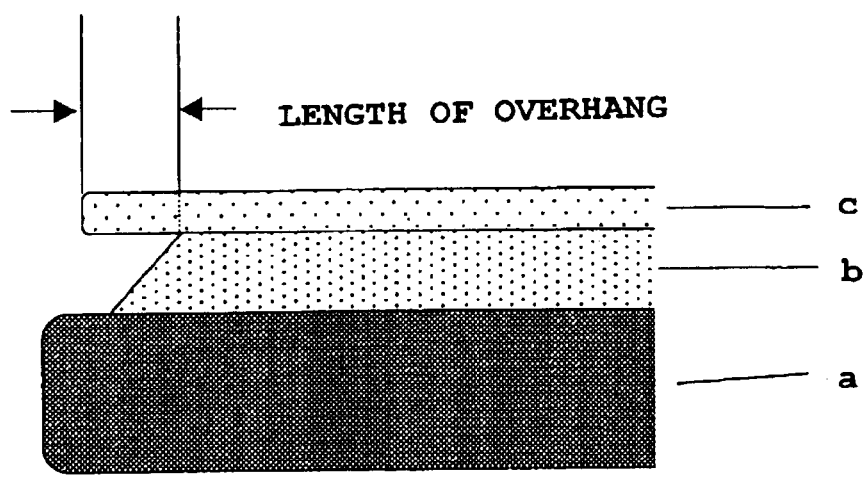
FIG. 2 is a view illustrating an example of wiring line profiles.

Prior to the examination of wiring line profile, the photoresist resin layer on the substrate surface was removed by dissolution with acetone. FIG. 2 shows an example of wiring line profiles. In FIG. 2, symbol a denotes an insulating substrate, b a first thin metal film (e.g., aluminum or an aluminum alloy), and c a second thin metal film (e.g., aluminum nitride or an aluminum nitride alloy).

The results of the evaluations are shown in Table 2. Table 2 shows the following. With the related-art etchant shown in Comparative Example 1, it is difficult to avoid the formation of overhangs in etching the multilayer film comprising an aluminum nitride alloy and an aluminum alloy. In contrast, the etchants and etching method of the invention produces an excellent effect that not only overhang formation can be minimized, but also photoresist alteration is prevented and etching resides are prevented from remaining around the electrode. In each of the Examples and Comparative Examples, use of the different etchant temperatures in the experiment resulted in different just etching times. However, in the case where the examinations of the substrate surface state gave the same results, the results of only one of these evaluations are shown. This applies in the following Examples and Comparative Examples.

Examples 8 to 12 and Comparative Example 3

Substrates having the same multilayer structure as those used in Example 1 were treated with a spray type continuous etching apparatus under the conditions shown in Table 3.

In the spray type continuous etching apparatus were conducted: a first etching step in which just etching was conducted until the end point (the point of time at which the quantity of light transmitted through the substrate reached 0.1% of the quantity of light transmitted through the substrate in a completely transmitting state (the quantity of transmitted light when nothing was present on the substrate)) was detected with an actinometric (transmitted-light) automatic detector; and a second etching step in which given over etching was successively conducted. After completion of these steps, the etchant remaining on the surfaces of the substrates was removed with an air knife and then completely removed by rinsing with pure water (cleaning step). In the first and second steps, the spray nozzles were kept being oscillated perpendicularly to the horizontal substrate traveling direction.

Subsequently, the substrates which had undergone the etching were treated with a continuous photoresist remover to remove the photoresist therefrom. Thereafter, an SiN insulating film was deposited in a thickness of 300 nm on the wirings on the substrates by sputtering. The insulating film was examined for dielectric breakdown voltage (18 points in each substrate).

The results of the dielectric breakdown voltage measurement are shown in Table 4. Each value of dielectric breakdown voltage shown is a standardized value, with the value for etching with the etchant of Comparative Example 3 being 1. Table 4 shows the following. The etchants and etching method of the invention produce an excellent effect that since a greatly improved wiring line profile is obtained, the SiN insulating film has exceedingly improved dielectric breakdown voltage characteristics as compared with the related-art technique (Comparative Example 3).

Electrode profiles after the etching were examined in the same manner as in Example 1. As a result, the overhang length was 30 nm or shorter in each of Examples 8 to 12. In particular, the electrode profiles in Examples 8 and 9 were a tapered shape with almost no overhang. In contrast, in Comparative Example 3, an overhang having a length of about 100 nm was observed.

Examples 13, 14 and 15

Etching was conducted in the same manner as in Examples 1 and 4, except that etchants having the same phosphoric acid concentration and nitric acid concentration as in Examples 1 and 4 and containing methanesulfonic acid in amounts of 2.5% by weight and 1.25% by weight, respectively, were used. After the etching, wiring line profiles were examined and evaluated in the same manner as in Examples 1 and 4. The etching conditions and the evaluation results are shown in Table 5 and Table 6, respectively.

The results given in Table 6 show that when methanesulfonic acid is used in place of acetic acid, etchants which have the same excellent effects as the etchants containing acetic acid and are free from the odor characteristic of acetic acid can be provided.

Example 16

Glass substrates having the same multilayer structure as those used in Example 1 were subjected to continuous etching using the same etchant, etching conditions (etchant temperature, spray pressure, etc.), and spray type continuous etching apparatus as in Example 12. Prior to this continuous etching, an etchant replenisher composition, replenishment timing, and replenishment amount were determined from the etchant composition, etchant temperature, and other factors so that the total acid amount in the etchant was kept in the range of from 0.9A to 1.2A, wherein A was the total acid amount in the etchant before etching initiation. The replenisher composition was nitric acid/acetic acid/water=6.6/9.0/ 84.4 [wt %], and the replenishment amount was 1.5 l/hr.

The replenishment timing was as follows. The replenisher was intermittently supplied to the etching system at a given interval so as to result in that replenishment amount per unit time period (1.5 l/hr). Continuous etching was conducted while thus regulating the total acid amount in the etchant. The substrates etched were evaluated in the same manner as in Example 12.

Furthermore, an etchant (original etchant) was suitably added to keep the etchant amount in the etching system within a given range so that spray troubles caused by an etchant level decrease, such as cavitation in the etchant feed pump and exposure of the heater in the etchant tank, could be avoided. The original etchant was added at 18 hours and at 62 hours after initiation of the etching.

Figure 3:
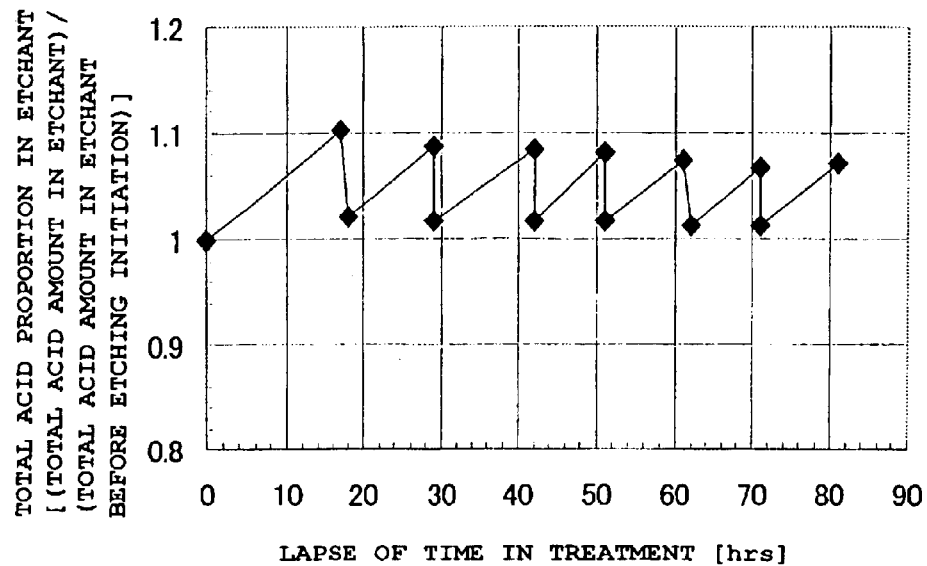
FIG. 3 is an illustration showing the change of total acid proportion in an etchant with the lapse of time in etching treatment.

In FIG. 3 and Table 8 are shown the replenishment timing and the change of total acid amount in the etchant with the lapse of time in the etching treatment.

Figure 4:
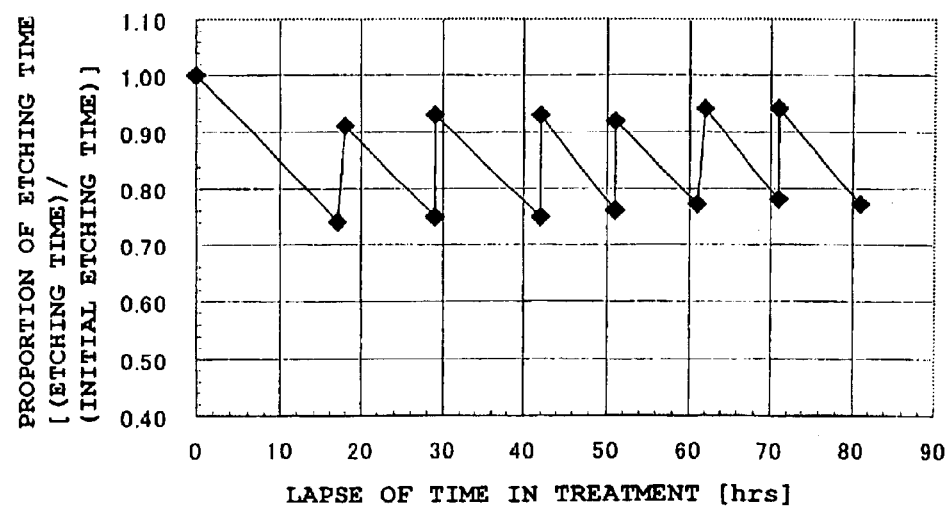
FIG. 4 is an illustration showing the change of the proportion of total etching time with the lapse of time in etching treatment.

As a measure of the change of a property of the etchant (etching rate) with the lapse of time in the etching treatment, the change of the proportion of the total time period required for etching completion (total etching time) is shown in FIG. 4 and Table 9. The term "total etching time" herein means the sum of the just etching time and the over etching time. The term "proportion of total etching time" means the ratio of the total etching time at each point of time after etching initiation to the etching time for the etchant just after etching initiation [(total etching time)/(total etching time just after etching initiation)].

FIGS. 3 and 4 and Tables 8 and 9 show the following. According to the etching method of the invention, the rate of etching can be regulated by supplying an etching replenisher and thereby keeping the total acid amount in the etchant in a proper range. Thus, it has become possible to stably conduct the desired etching over long.

Compositional analysis of the etchant after etching replenisher supply revealed that the etchant almost recovered its original composition. Electrode profiles after the etching were examined in the same manner as in Example 1. As a result, the overhang length had been regulated to 30 nm or shorter for each treatment time period. This shows that the etchant and etching method of the invention are superior.

Furthermore, substrates respectively having AlNdN and AlNd deposited thereon in a thickness of 200 nm were used to examine the etchant of Example 4 for etching rate and etching rate ratio. The results obtained are shown in Table 7. The nitrogen content in the AlNdN was 30 at %.

Table 7 shows the following. When the spray pressure was in the range of from 0.04 to 0.12 MPa, lower spray pressures resulted in higher etching rates for the second layer (AlNdN) and, hence, in lower etching rate ratios.

This means that not only the effect of diminishing overhangs is high but also the productivity in the etching apparatus is improved. These results show that spray pressures of 0.08 MPa and lower are especially preferred. Furthermore, spray pressures of 0.04 MPa and higher are preferred in that the etchant ejected from the spray nozzles can spread evenly to make even etching possible.

In the Examples given above, the etching test samples were produced under such conditions that a thin metal film of AlNd was deposited as the lower, i.e., first, layer in a thickness of 200 nm and a thin metal film of AlNdN having a degree of nitriding of 0.6 (nitrogen content, 30 at %) was deposited as the second layer in a thickness of 50 nm. However, the effects of the invention are not limited to those brought about by such constitution.

The AlNdN film as the second thin metal layer is formed for the purposes of improving chemical resistance, enhancing the hardness of the film surface, inhibiting hillock generation, and inhibiting the formation of a diffusion reaction layer at the contact interface between the wiring material and ITO. For obtaining these effects, this film can be regulated so as to have a degree of nitriding of from 0.1 to 0.9 (nitrogen content of from 5 to 45 at %). This regulation of degree of nitriding in the case of using sputtering can be easily accomplished by changing the proportion of argon to nitrogen in an argon/nitrogen mixed gas. For obtaining the same effects, the thickness of the AlNdN film is preferably 5 nm or larger.

There is no particular upper limit on the thickness of the AlNdN film from the standpoint of the effects of the invention, and the upper limit should be determined by the wiring resistance required. For example, the thin metal film of AlNdN having a degree of nitriding of 0.6 (nitrogen content, 30 at %) deposited as the second layer in the etching test samples used above has a resistivity of about 60 $\mu\Omega$·cm, which is about 10 times the resistivity of the underlying thin metal film of AlNd as the first layer. In this case, the proportion of the thickness of the AlNdN film to that of the AlNd film (AlNdN/AlNd) is preferably regulated so as not to exceed 1 as a rough aim, from the standpoint of not impairing the low resistance which is an excellent feature of aluminum alloys.

Furthermore, methods for forming the thin metal film of aluminum nitride as the second layer are not limited to reactive sputtering. Other methods usable for the film formation include, for example, the ion nitriding method which comprises depositing an aluminum layer and then treating the surface thereof with a nitrogen plasma and a method in which an aluminum layer is treated by annealing in a nitrogen atmosphere.

Moreover, elements which can be added to the thin metal film as the second layer are not limited to nitrogen. Even when any of oxygen, silicon, and carbon is added, the effects of the invention can be likewise produced.

TABLE 1

Etchant composition and etching temperature in Examples 1 to 7 and Comparative Examples 1 and 2

| | | Phosphoric acid [wt %] | Nitric acid [wt %] | Acetic acid [wt %] | Water [wt %] | Etching temperature [° C.] |
|---|---|---|---|---|---|---|
| Example | 1 | 50.0 | 5.0 | 2.5 | 42.5 | 40, 45, 49 |
| | 2 | 50.0 | 5.0 | 10.0 | 35.0 | 40, 45, 49 |
| | 3 | 50.0 | 7.5 | 2.5 | 40.0 | 40, 45, 49 |
| | 4 | 50.0 | 10.0 | 2.5 | 37.5 | 40, 45, 49 |
| | 5 | 57.0 | 5.5 | 2.2 | 35.3 | 40, 45, 49 |
| | 6 | 54.8 | 10.4 | 2.3 | 32.5 | 40, 45, 49 |
| | 7 | 65.0 | 9.4 | 3.4 | 22.2 | 40, 45, 49 |
| Comparative Example | 1 | 78.5 | 2.85 | 3.02 | 15.63 | 40 |
| | 2 | 50.0 | 17.5 | 15 | 17.5 | 40, 45, 49 |

TABLE 2

Results of evaluations of electrode part overhang, residue around electrode part, and state of photoresist

| | | Over etching = 100% | | Over etching = 150% | | State of photoresist |
|---|---|---|---|---|---|---|
| | | Overhang state | Residue state | Overhang state | Residue state | |
| Example | 1 | ☆ | ○ | ☆ | ○ | ○ |
| | 2 | ☆ | ○ | ☆ | ○ | ○ |
| | 3 | ◉ | ○ | ◉ | ○ | ○ |
| | 4 | ◉ | ○ | ◉ | ○ | ○ |
| | 5 | ◉ | ○ | ◉ | ○ | ○ |
| | 6 | ◉ | ○ | ◉ | ○ | ○ |
| | 7 | ○ | ○ | ○ | ○ | ○ |
| Comparative Example | 1 | X | ○ | X | ○ | ○ |
| | 2 | ☆ | X | ☆ | X | X |

Overhang state (length):
X = 60 nm or longer
○ = 30 to shorter than 60 nm
◉ = 10 to shorter than 30 nm
☆ = shorter than 10 nm
State of residue around electrode part:
○ = not observed
X = observed
State of photoresist:
○ = no change
X = swelled, cracked

TABLE 3

Examples 8–12 and Comparative Example 3
Conditions for spray type Continuous etching

| | | Etchant | | | | Etching Conditions | | |
|---|---|---|---|---|---|---|---|---|
| | | Phosphoric acid [wt %] | Nitric acid [wt %] | Acetic acid [wt %] | Water [wt %] | Temperature [° C.] | Spray pressure [MPa] | Over etching amount [%] |
| Example | 8 | 50 | 5 | 2.5 | 42.5 | 40 | 0.05 | 200 |
| | 9 | | | | | 45 | 0.05 | 250 |
| | 10 | | | | | 49 | 0.05 | 200 |
| | 11 | 50 | 10 | 2.5 | 37.5 | 45 | 0.05 | 250 |
| | 12 | | | | | 49 | 0.05 | 200 |
| Comparative Example | 3 | 78.5 | 2.85 | 3.02 | 15.63 | 40 | 0.15 | 90 |

TABLE 4

Examples 8–12 and Comparative Example 3
Results of dielectric breakdown voltage measurement

| | | Dielectric Breakdown Voltage (relative values with the values in Comparative Example 3 being 1) | | |
|---|---|---|---|---|
| | | Average | Minimum | Maximum |
| Example | 8 | 1.51 | 1.75 | 1.16 |
| | 9 | 1.69 | 2.01 | 1.24 |
| | 10 | 1.41 | 1.55 | 1.18 |
| | 11 | 1.39 | 1.74 | 1.15 |
| | 12 | 1.33 | 1.58 | 1.30 |
| Comparative Example | 3 | 1.00 | 1.00 | 1.00 |

TABLE 5

Etchant composition and etching temperature in Examples 13 to 15

| | | Phosphoric acid [wt %] | Nitric acid [wt %] | Methanesulfonic acid [wt %] | Water [wt %] | Etching temperature [° C.] |
|---|---|---|---|---|---|---|
| Example | 13 | 50.0 | 5.0 | 2.5 | 42.5 | 40, 45, 49 |
| | 14 | 50.0 | 10.0 | 2.5 | 37.5 | 40, 45, 49 |
| | 15 | 50.0 | 10.0 | 1.25 | 38.75 | 40, 45, 49 |

TABLE 6

Results of evaluations of electrode part overhang, residue around electrode part, and state of photoresist

| | | Over etching = 100% | | Over etching = 150% | | State of photoresist |
|---|---|---|---|---|---|---|
| | | Overhang state | Residue state | Overhang state | Residue state | |
| Example | 13 | ☆ | ○ | ☆ | ○ | ○ |
| | 14 | ◉ | ○ | ◉ | ○ | ○ |
| | 15 | ◉ | ○ | ◉ | ○ | ○ |

Overhang state (length):
X = 60 nm or longer

TABLE 6-continued

Results of evaluations of electrode part overhang,
residue around electrode part, and state of photoresist

| | Over etching = 100% | | Over etching = 150% | | State of photo-resist |
|---|---|---|---|---|---|
| | Overhang state | Residue state | Overhang state | Residue state | |

○ = 30 to shorter than 60 nm
◉ = 10 to shorter than 30 nm
☆ = shorter than 10 nm
State of residue around electrode part:
○ = not observed
X = observed
State of photoresist:
○ = no change
X = swelled, cracked

TABLE 7

Results of evaluations of
etching rate and etching rate ratio

| | Etching rate (nm/min) | | Etching rate ratio |
|---|---|---|---|
| | Second layer (AlNdN) | First layer (AlNd) | (AlNd/AlNdN) |
| 0.04 MPa | 28.5 | 184.0 | 6.45 |
| 0.06 MPa | 25.9 | 173.1 | 6.68 |
| 0.08 MPa | 26.8 | 181.4 | 6.77 |
| 0.10 MPa | 24.0 | 189.0 | 7.87 |
| 0.12 MPa | 24.2 | 183.9 | 7.59 |

(Etching conditions were an etchant composition comprising 50 wt % phosphoric acid, 10 wt % nitric acid, and 2.5 wt % acetic acid and an etchant temperature of 49° C.)

TABLE 8

| Treatment time*1 [hr] | Total acid amount [meq/g] | Proportion of total acid amount [-] |
|---|---|---|
| 0 | 12.331 | 1 |
| 17 | 13.589 | 0.02381 |
| <u>18</u> | 12.589 | 1.020923 |
| 29 | 13.406 | 1.087179 |
| <u>29</u> | 12.546 | 1.017436 |
| 42 | 13.378 | 1.084908 |
| <u>42</u> | 12.546 | 1.017436 |
| 51 | 13.34 | 1.081826 |
| 51 | 12.548 | 1.017598 |
| 61 | 13.243 | 1.07396 |
| <u>62</u> | 12.493 | 1.013138 |
| 71 | 13.172 | 1.068202 |
| <u>71</u> | 12.501 | 1.013786 |
| 81 | 13.223 | 1.072338 |

*1: At the points of time underlined, replenisher was supplied. The total acid amount was measured before and after the replenishment. (The value before the replenishment is shown in the row of the point of time with no underline.)

TABLE 9

| Treatment time*1 [hr] | Total acid amount [meq/g] | Proportion of etcing time [-] |
|---|---|---|
| 0 | 12.331 | 1 |
| 17 | 13.589 | 0.74 |
| <u>18</u> | 12.589 | 0.91 |
| 29 | 13.406 | 0.75 |
| <u>29</u> | 12.546 | 0.93 |
| 42 | 13.378 | 0.75 |
| <u>42</u> | 12.546 | 0.93 |
| 51 | 13.34 | 0.76 |
| <u>51</u> | 12.548 | 0.92 |
| 61 | 13.243 | 0.77 |
| <u>62</u> | 12.493 | 0.94 |
| 71 | 13.172 | 0.78 |
| <u>71</u> | 12.501 | 0.94 |
| 81 | 13.223 | 0.77 |

*1: At the points of time underlined, replenisher was supplied. The total acid amount was measured before and after the replenishment. (The value before the replenishment is shown in the row of the point of time with no underline.)

As described above in detail, the etchant and etching method of the invention have the following effects. When the etchant, which contains phosphoric acid and nitric acid in specific amounts, is used for the etching of a multilayer film comprising a first layer made of aluminum or an aluminum alloy and formed thereon a second layer made of aluminum or an aluminum alloy each containing at least one element selected from nitrogen, oxygen, silicon, and carbon, then the two layers constituting the multilayer film can be simultaneously etched through only one etching operation while preventing the upper layer from forming overhangs.

Namely, a wiring material comprising the low-resistance multilayer film having excellent electrical properties can be stably and evenly etched with satisfactory precision. Consequently, a low-cost wiring having high reliability can be provided and this, in turn, enables highly reliable liquid-crystal displays and the like to be provided at low cost.

While the invention has been described in detail and with reference to specific embodiments thereof, it will be apparent to one skilled in the art that various changes and modifications can be made therein without departing from the spirit and scope thereof.

What is claimed is:

1. An etchant for a multilayer film comprising a first layer comprising aluminum or an aluminum alloy having formed thereon a second layer comprising aluminum or an aluminum alloy each containing at least one element selected from the group consisting of nitrogen, oxygen, silicon, and carbon, the etchant having a phosphoric acid content of from 35 to 65% by weight and a nitric acid content of from 0.5 to 15% by weight.

2. The etchant as claimed in claim 1, which further comprises acetic acid and has an acetic acid content of from 1 to 15% by weight.

3. The etchant as claimed in claim 1, wherein the ratio of the thickness of the second layer to that of the first layer is from 1/10 to 1/1.

4. A method of etching a multilayer film formed on a surface of a substrate and comprising a first layer comprising aluminum or an aluminum alloy having formed thereon a second layer comprising aluminum or an aluminum alloy each containing at least one element selected from the group consisting of nitrogen, oxygen, silicon, and carbon, the method comprising using an etchant which comprises at least phosphoric acid and nitric acid and has a phosphoric acid content of from 35 to 65% by weight and a nitric acid content of from 0.5 to 15% by weight.

5. The method of etching as claimed in claim 4, wherein the etchant further comprises acetic acid and has an acetic acid content of from 1 to 15% by weight.

6. The method of etching as claimed in claim 4, wherein the ratio of the thickness of the second layer to that of the first layer is from 1/10 to 1/1.

7. The method of etching as claimed in claim 4, wherein after completion of just etching, over etching is conducted for a period of from 100 to 500% based on the time period used for the just etching.

8. The method of etching as claimed in claim 4, wherein the multilayer film formed on the substrate surface is etched by supplying the etchant to the substrate surface at a spray pressure of from 0.01 to 0.3 MPa from a spray nozzle disposed so that the minimum distance between the nozzle tip and the substrate surface is from 50 to 1,000 mm to thereby bring the etchant into contact with the substrate surface.

9. The etchant as claimed in claim 1, which comprises an aliphatic or aromatic sulfonic acid, a salt thereof or both of them in an amount of from 0.1 to 15% by weight.

10. The etchant as claimed in claim 9, wherein the aliphatic or aromatic sulfonic acid, salt thereof or both of them is an alkanesulfonic acid having 1 to 10 carbon atoms, a salt thereof or both of them.

11. A method of etching which comprises using the etchant as claimed in claim 9.

12. The method of etching as claimed in claim 4, wherein etchant ingredients corresponding to those consumed by etching or taken out of the etching system are additionally supplied to the etchant so as to result in a total acid amount of from 0.8A to 1.5A [meq/g], wherein A is the total acid amount [meq/g] in the etchant before the etching, and in a phosphoric acid content of from 35 to 65% by weight and a nitric acid content of from 0.5 to 15% by weight, and the resultant etchant is used to conduct etching.

13. The method of etching as claimed in claim 12, wherein the etchant ingredients corresponding to those consumed by etching or taken out of the etching system are supplied separately or as a mixture thereof to the etching system either continuously or intermittently.

14. The method of etching as claimed in claim 12, wherein the composition of the etchant in an etching step is continuously or intermittently monitored with a concentration meter and the results of the compositional analysis are fed back simultaneously with the monitoring to continuously or intermittently supply a replenisher to the etchant.

* * * * *